United States Patent
Schuhmacher et al.

(10) Patent No.: US 10,759,975 B2
(45) Date of Patent: Sep. 1, 2020

(54) COMPOSITE MATERIAL AND ADHESIVE BONDING MATERIAL HAVING THE COMPOSITE MATERIAL

(71) Applicant: SCHOTT AG, Mainz (DE)

(72) Inventors: Jörg Schuhmacher, Kornwestheim (DE); Philipp Treis, Mainz (DE); Jochen Drewke, Mainz (DE); Hans-Joachim Schmitt, Ockenheim (DE); Martun Hovhannisyan, Frankfurt (DE); Friedrich Siebers, Nierstein (DE); Yvonne Menke-Berg, Wiesbaden (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 16/208,639

(22) Filed: Dec. 4, 2018

(65) Prior Publication Data

US 2019/0169473 A1 Jun. 6, 2019

(30) Foreign Application Priority Data

Dec. 4, 2017 (DE) .................. 10 2017 128 734

(51) Int. Cl.
| | |
|---|---|
| C09J 11/04 | (2006.01) |
| C03C 8/24 | (2006.01) |
| C03C 14/00 | (2006.01) |
| C03C 10/00 | (2006.01) |
| H01L 23/29 | (2006.01) |
| C03C 3/21 | (2006.01) |
| C08K 3/22 | (2006.01) |
| C08K 3/32 | (2006.01) |
| C08K 3/34 | (2006.01) |
| C08K 3/40 | (2006.01) |
| C08K 7/20 | (2006.01) |
| C09J 9/00 | (2006.01) |
| C09J 163/00 | (2006.01) |

(52) U.S. Cl.
CPC .................. *C09J 11/04* (2013.01); *C03C 3/21* (2013.01); *C03C 8/24* (2013.01); *C03C 10/00* (2013.01); *C03C 14/004* (2013.01); *C08K 3/22* (2013.01); *C08K 3/32* (2013.01); *C08K 3/34* (2013.01); *C08K 3/40* (2013.01); *C08K 7/20* (2013.01); *C09J 9/00* (2013.01); *C09J 163/00* (2013.01); *H01L 23/295* (2013.01); *C03C 2214/04* (2013.01); *C08K 2201/003* (2013.01)

(58) Field of Classification Search
CPC .. C09J 11/04; C09J 163/00; C09J 9/00; C03C 3/21; C03C 8/24; C03C 2214/04; H01L 23/295; C08K 3/22; C08K 2201/003
See application file for complete search history.

(56) References Cited

U.S. PATENT DOCUMENTS

| | | | |
|---|---|---|---|
| 3,279,905 A | 10/1966 | Wood | |
| 3,495,961 A | 2/1970 | Lange | |
| 3,499,745 A | 3/1970 | Plumat | |
| 4,043,507 A | 8/1977 | Wace | |
| 5,484,559 A | 1/1996 | Johns | |
| 5,500,162 A | 3/1996 | Theisen | |
| 5,719,225 A | 2/1998 | Hirano | |
| 6,187,700 B1 | 2/2001 | Merkel | |
| 6,197,073 B1 | 3/2001 | Kadner | |
| 6,209,352 B1 | 4/2001 | Beall | |
| 6,506,699 B1 | 1/2003 | Shindo | |
| 2003/0187117 A1* | 10/2003 | Starkovich | B82Y 30/00 524/406 |
| 2004/0007789 A1 | 1/2004 | Vlach | |
| 2008/0012156 A1 | 1/2008 | Papathomas | |
| 2011/0140289 A1 | 6/2011 | Shiobara | |
| 2016/0185652 A1 | 6/2016 | Li | |

FOREIGN PATENT DOCUMENTS

| | | |
|---|---|---|
| DE | 19521330 | 12/1995 |
| DE | 10111938 | 9/2002 |
| DE | 102006027133 | 12/2007 |
| DE | 102006039462 | 3/2008 |
| DE | 102014220457 | 4/2016 |
| DE | 102015107819 | 6/2016 |
| EP | 1135343 | 7/2003 |
| EP | 1927394 | 6/2008 |
| EP | 3360848 | 8/2018 |
| KR | 1020140080183 | 6/2014 |
| WO | 2015014930 A1 | 2/2015 |

* cited by examiner

*Primary Examiner* — Noah S Wiese
(74) *Attorney, Agent, or Firm* — Ohlandt, Greeley, Ruggiero & Perle, L.L.P.

(57) ABSTRACT

A composite material is provided that includes at least one first material and particles. The particles have a negative coefficient of thermal expansion and the particles have a sphericity $\Psi$ of at least 0.7. The composite material includes at least 30 vol % of the particles at a particle size of $d_{50} \leq 1.0$ μm or at least 40 vol % of the composite material at a particle size $d_{50} > 1.0$ μm.

13 Claims, No Drawings

COMPOSITE MATERIAL AND ADHESIVE BONDING MATERIAL HAVING THE COMPOSITE MATERIAL

CROSS REFERENCE TO RELATED APPLICATIONS

This application claims the benefit under 35 USC § 119 of German Application No. 102017128734.5 filed Dec. 4, 2017, the entire contents of which are incorporated herein by reference.

BACKGROUND

1. Field of the Invention

The invention relates to a composite material comprising at least one first material and particles, the particles having a negative coefficient α of thermal expansion, and to an adhesive bonding material comprising the composite material.

2. Description of Related Art

Materials with low thermal expansion have been state of the art for many years. For example it is known that certain crystalline compounds, cordierite for example, at least in certain directions in the crystal lattice have a very low expansion, which may even take on negative values; in other words, a monocrystal composed of such a compound reacts to temperature increase by undergoing, at least in one defined spatial direction, a contraction rather than an expansion. Also known is the production of workpieces which comprise low thermal expansion compounds, meaning that the workpiece overall exhibits very low thermal expansion. It is known practice, for example, to use cordierite-comprising workpieces in the area of exhaust gas catalysts.

A known crystal with overall negative expansion is β-eucryptite. By way of example, the U.S. Patent Specification U.S. Pat. No. 6,506,699 B1 describes a material having a negative coefficient of thermal expansion, this material taking the form of a glass-ceramic and comprising various $SiO_2$-based crystal phases, including β-eucryptite in particular. The material is obtained via a melting operation, in which first of all a glass is melted and then the melt is subjected to rapid cooling. This is followed by the formation of a glass-ceramic phase from the precursor glass, by crystallization in a further thermal operation. The glass described in U.S. Pat. No. 6,506,699 B1 is notable for a high $SiO_2$ content of between 40 and 60 wt % of the composition. The resulting glass-ceramic material has a coefficient of thermal expansion in the range between $-2.5 \times 10^{-6}$/K to $-100 \times 10^{-6}$/K in the temperature range from $-40°$ C. to $+160°$ C.

The U.S. Patent Specification U.S. Pat. No. 6,209,352 B1 describes a method for producing a glass-ceramic article that comprises the following steps: a) producing an initial glass, b) heat-treating the initial glass to give a glass-ceramic with anisotropic crystals, these crystals having a negative thermal expansion in at least one spatial direction and having an average size of more than 5 μm, so causing stresses to occur in the glass-ceramic on cooling and resulting in microcracks within the glass-ceramic. Workpieces with a low coefficient of thermal expansion are indeed obtained in this way. Their coefficient is between $-3.0 \times 10^{-6}$/K and $-9.0 \times 10^{-6}$/K. However, this figure is influenced by the microcracks in the material, and so the figure determined for the thermal expansion is lower than that actually contributed intrinsically by the material. This results in unwanted hysteresis effects on traversal of a number of temperature cycles, and hence there are numerous applications for which the material cannot be used.

Also known, furthermore, are materials with different compositions that have a low and more particularly a negative thermal expansion. For example, the U.S. Patent Specification U.S. Pat. No. 6,187,700 B1 describes materials having a negative coefficient of thermal expansion and comprising tungstates. These materials are obtained via a sintering operation which involves mixing solids with one another and then subjecting the mixture to a temperature treatment. This produces a ceramic material which has a coefficient of thermal expansion in the range between $-5.0 \times 10^{-6}$/K and $-8.8 \times 10^{-6}$/K and which is free from microcracks.

Besides the tungstates disclosed in the aforesaid patent specification, the scientific literature also includes descriptions of molybdates and vanadates having negative thermal expansion behaviour [e.g. C. Lind, Materials 5 (2012) 1125-1154]. They can be produced either by a reactive sintering operation from the individual oxide components, as described for example for $Y_2Mo_3O_{12}$ in B. A. Marinkovic et al., Solid State Sciences 7 (2005) 1377-1383, or via a (modified) sol-gel operation, as set out for example for W-doped $ZrV_2O_7$ in Q. Liu et al., Applied Surface Science 313 (2014) 41-47.

SUMMARY

It is an object of the present invention to provide a composite material comprising at least one first material and particles, the particles having a negative coefficient α of thermal expansion. The composite material is to have substantially higher levels of particle filling than has hitherto been achievable. It is to be easier and more economical to produce and is to be suitable for the adhesive bonding of articles or as an adjuvant to adhesives.

The object is achieved by means of a composite material comprising at least one first material and particles, where the particles have a negative coefficient α of thermal expansion, the particles have a sphericity Ψ of least 0.7, and the composite material comprises at least 30 vol % of the particles at a particle size of $d_{50} < 1.0$ μm, or the composite material comprises at least 40 vol % of the particles at a particle size $d_{50} > 1.0$ μm.

The sphericity Ψ here is a parameter of how sphere-shaped the particle is. According to the definition of H. Wadell, the sphericity Ψ of a particle is calculated as the ratio of the surface area of a sphere of equal volume to the surface area of the particle:

$$\Psi = \frac{\sqrt[3]{36\pi V_P^2}}{A_P}$$

where $V_P$ denotes the volume of the particle and $A_P$ its surface area.

Typical sphericity values Ψ for different types of particle are as follows:
Sphere: 1.0
Drop, bubble, round grain: 0.7-1.0
Angular grain: 0.45-0.6
Needle-shaped particle: 0.2-0.45
Plate-shaped particles: 0.06-0.16

Particle with severely riven surface: $10^8$-$10^{-4}$

High sphericities Ψ in the sense of the present invention are achieved when Ψ has a value of at least 0.7.

Definition of d, especially $d_{50}$:

Independently of their sphericity Ψ, the particles of a powder are generally distinguished with the aid of a volume-equivalent sphere diameter, which has to be measured, and are ordered into selected classes according to their size. To represent a particle size distribution, a determination is made of the quantity fractions with which the respective classes of particle are present in the powder.

This is done using different quantity types. If the particles are counted, the quantity type is the number. In the case of weighings, conversely, it is the mass or, in the case of homogeneous density ρ, the volume. Other types are derived from lengths, projection surfaces and surface areas.

The following are distinguished:

| Quantity type: | Index r: |
| --- | --- |
| Number | 0 |
| Length | 1 |
| Area | 2 |
| Volume (mass) | 3 |

One common quantity measure for describing the particle size distribution in powders is formed by the cumulative distribution $Q_r$. The index r identifies the quantity type according to the table above.

The cumulative distribution function Qr(d) indicates the standardized quantity of all particles having an equivalent diameter less than or equal to d. Explicitly defined below are cumulative distributions of the two most commonplace quantity types:

PARTICLE NUMBER (r=0)

Let $N_i$ be the number of all particles investigated with a diameter d less than or equal to the diameter $d_i$ under consideration, and let N be the total number of all particles investigated. In that case:

$$Q_0(d_i) = \frac{N_i}{N}$$

PARTICLE MASS (r=3)

Let $m_i$ be the mass of all particles investigated with a diameter d less than or equal to the diameter $d_i$ under consideration, and let m be the total mass of all particles investigated. In that case $$Q_3(d_i) = \frac{m_i}{m}$$

In the sense of the invention, $d_i$ values are understood to be equivalent diameter values for which the $Q_3(d_i)$ cumulative distribution function adopts the following values:

$d_{10}$: $Q_3(d_{10})$=10%, i.e. 10 wt % of the particles have a diameter less than or equal to $d_{10}$.

$d_{50}$: $Q_3(d_{50})$=50%, i.e. 50 wt % of the particles have a diameter less than or equal to $d_{50}$.

$d_{90}$: $Q_3(d_{90})$=90%, i.e. 90 wt % of the particles have a diameter less than or equal to $d_{90}$.

$d_{99}$: $Q_3(d_{99})$=99%, i.e. 99 wt % of the particles have a diameter less than or equal to $d_{99}$.

$d_{100}$: $Q_3(d_{100})$=100%, i.e. 100 wt % of the particles have a diameter less than or equal to $d_{100}$.

Surprisingly it has emerged that with particles having a sphericity Ψ of at least 0.7 it is possible to achieve a substantially higher particle fill level. Accordingly, composite materials of the invention are accessible which comprise at least 30 vol % of the particles when the size thereof has a $d_{50} \leq 1.0$ μm, or at least 40 vol % of the particles when the size thereof adopts a $d_{50} > 1.0$ μm.

In one particularly preferred embodiment of the invention, the particles have a sphericity Ψ of at least 0.8 and more preferably of at least 0.9.

In another embodiment, the composite material preferably comprises at least 35 vol % of the particles and more preferably at least 40 vol % of the particles when the size of the particles has a $d_{50} \leq 1.0$ μm, and preferably at least 45 vol % of the particles and more preferably at least 50 vol % of the particles when the size of the particles adopts a $d_{50} > 1$ μm.

The first material is preferably selected from the group of polymers, more particularly of epoxy resins or acrylate resins, or from the group of glasses, more particularly glass frits or glass solders, or from combinations of these groups.

The particles are preferably selected from the group of the following compounds or from combinations of these groups: $ZrW_2O_8$, $Y_2Mo_3O_{12}$, $LiAlSiO_4$, $LiAlSi_2O_6$, phase systems $ZrO_2$—$WO_3$—$Al_2O_3$—$P_2O_5$.

The particles preferably have a negative coefficient α of thermal expansion in the range from $-1.0 \times 10^{-6}$/K to $-100 \times 10^{-6}$/K in the temperature range from −50° C. to 200° C.

The particles are preferably produced by means of at least one of the following processes: spray calcination (especially using the pulsation reactor technology), filamentization from a salt melt, droplet formation, glass sphere production.

With regard to the prior art, therefore, there is a desire for negative-expansion particles in powder form that have a high sphericity Ψ.

By way of example, the following processes will be recited at this point:

GLASS SPHERE PRODUCTION: The path to producing particles from a negative-expansion material makes use of the fact that one of the ways in which these materials can be produced is via the glass-ceramic route: for this purpose, in a commonplace melting process, a green glass—which ideally is crystal-free—is first melted, and in the course of a downstream heating step is ceramicized and at the same time converted into the actual glass-ceramic. During cooling, the glass melt produced in the first process step may in principle be subjected to the customary hot shaping processes employed for the production of glass spheres. For this purpose, the following process approaches are conceivable: in the process disclosed in U.S. Pat. No. 3,499,745, a molten glass jet is caused to impinge on a striking wheel which, when sufficiently high forces are realized, causes the glass jet to break up into component strands, referred to as filaments. These filaments are subsequently spun first through a heated region, a cooling region, and finally into a collection zone. Because of the tendency to minimize the surface tension, this tendency taking effect after the formation of filaments, the filaments become round. According to EP 1 135 343 B1, a sufficient sphericity is achieved when the relaxation time elapsing from the time of filament formation can be described by the equation T=(d×μ)/σ. In this equation, d is the diameter of the spheres formed, μ is the viscosity of the filament and σ is the surface tension of the filament during the relaxation time. As described in U.S. Pat. No. 3,495,961, the striking wheel may also be replaced by a rotor. Other known processes for producing glass spheres include the inflation of a burning gas stream through a molten glass stream in order to divide up the glass into individual particles. Such processes are disclosed in U.S. Pat. No. 3,279,905. For this purpose, alternatively, glass particles of relatively low sphericity may be (partially) melted again, as described in DD 282 675 A5, by being introduced into a flame, whereupon they undergo rounding.

FILAMENTIZATION OF SALT MELTS: In analogy to the filament formation described above and to the subsequent formation of spherical drops from a molten glass jet, owing to relaxation effects for reducing the surface energy, this process may take place correspondingly from a jet of material generated from a salt melt. In technological terms, it is possible here to proceed similarly, bearing in mind that the viscosity of a molten glass may differ considerably from that of a salt melt, according to the temperature selected in the respective case. The material in droplet form must be converted first of all—by passage through an even hotter region—into a pre-ceramic intermediate, which is frequently porous but, apart from isotropic contraction, is dimensionally stable—and must subsequently be converted further—either still in the same heating step or in a separate, additional, downstream heating step—into the actual negative-expansion material. In this way, ideally, densely sintered spheres of the negative-expansion material are obtained.

SPRAY CALCINATION (USING THE PULSATION REACTOR TECHNOLOGY): When using a pulsation reactor, as disclosed in DE 10111938 A1, DE 102006027133 A1, DE 102006039462 A1 or EP 1927394 A1, a gaseous or a liquid mixture in the form of a solution, suspension or dispersion comprising all the components for producing the negative-expansion material is introduced into a pulsating stream of hot gas—in the latter case, by fine atomization. The pulsating stream of hot gas itself is generated within a hot gas generator in the reactor, through the combustion of natural gas or hydrogen with ambient air. Depending on the position chosen for sprayed introduction, the temperatures prevailing there are between 500 and 1500° C. Within the pulsating stream of hot gas, an intermediate is formed which, by further thermal aftertreatment in the same reactor or in a different reactor, is converted into the ultimate form. In the former case, the reactor may be provided with an additional fuel supply, which is positioned downstream of the point of spray introduction, along the pulsating stream of hot gas.

DROPLET FORMATION PROCESS: In the case of the droplet formation process, the starting point is an aqueous or solvent-based salt solution or a sol as precursor for the negative-expansion material, or else a nanoparticulate solution of the negative-expansion material, and the sol or solution is converted into droplets via a suitable nozzle apparatus. After they have been formed, the droplets either are dried directly in a suitable process gas stream, as described in U.S. Pat. No. 4,043,507 or 5,500,162, or else first, by introduction into a suitable liquid medium, as disclosed in U.S. Pat. Nos. 5,484,559, 6,197,073, US 2004/0007789 A1 or WO 2015/014930 A1, are first stimulated to further flocculation and subsequently are aged, washed and dried. The spherical, porous green bodies produced in this way undergo a subsequent sintering step in which they are compacted to form a negative-expansion ceramic body with high sphericity.

Formulations are specified for producing composite materials (polymer-based composites or composite precursors), for use as adhesive bonding materials, for example, in which, at the same volume fill levels, the viscosity of the particle-filled formulation when using non-spherical particles is significantly higher than when using the particles of high sphericity produced in accordance with the invention, provided that particle size and/or particle-size distribution are the same in both cases.

Moreover, formulations are provided for producing composite materials (polymer-based composites or composite precursors), for use as adhesive bonding materials, for example, in which the corresponding formulations, without substantial change in the viscosity, can be provided with significantly higher fill levels in the case of the spherical variant than in the case of the non-spherical embodiment. The proviso in this case again is that in both cases there are no substantial differences in particle size and in particle-size distribution.

The object is also achieved by means of an adhesive bonding material comprising the composite material of the invention, more particularly for bonding packages for semiconductors.

DETAILED DESCRIPTION

A feature common to all of the processes described to date in the prior art for producing the negative-expansion materials is that the raw material generated in the respective operation is obtained either monolithically or at least in an undefinedly coarse-grained structure and requires further comminution steps, generally operations of fine grinding, to bring it into an ultimate presentation form as a powder with defined particle size and particle-size distribution. The particle size to be obtained is frequently situated in the μm or sub-μm range. Further processing is possible only by such comminution. This further processing refers in particular to incorporation into organic compositions, as for example polymers or resin precursors thereof, which can be used as adhesives. Organic compounds, especially polymers, generally have very high thermal expansion. If such polymers are to be used for adhesive bonding, as for example for bonding inorganic materials, in the optical sector or in the chip industry, for example, there may be difficulties if the adhesive bond is exposed to substantial thermal fluctuations. Because of the very different expansion coefficients of the polymer and of the inorganic materials to be bonded, thermomechanical stresses are induced between the materials to be joined, and in the worst case may even lead to mechanical failure of the bonded component. Such failures can be avoided or at least significantly reduced by reducing the integral coefficient of thermal expansion, in other words the coefficient of expansion that results for the adhesive bonding material as a whole. This is brought about in a simple way through the addition of inorganic fillers with low thermal expansion. Known fillers employed nowadays for this purpose include $SiO_2$, not only in crystalline form but also amorphously in the form of what is called silica or of quartz glass particles. These $SiO_2$-based materials have a coefficient of thermal expansion which, while very small in amount, is nevertheless positive, with the value in the order of magnitude of approximately $+1 \times 10^{-6}$/K.

Via comminuting operations, such as said fine grinding operations, for example, as just mentioned for producing the negative-expansion powder materials having a particle size in the microscale or sub-microscale range, it is virtually impossible to produce spherical powder particles. Instead, fragmentary particles are formed in this case, featuring edges and angles. These particles, accordingly, have a sphericity of significantly less than 0.7.

In many applications, non-spherical particles of a single material are much more difficult to process than their spherical counterparts, assuming the same particle size and particle-size distribution. This circumstance is manifested in particular on incorporation into thermoplastic matrices and liquid matrices (as in the case of liquid resin precursors for thermoset adhesives): for the same volume fill levels, the viscosity of the particle-filled formulation is significantly higher in the case where non-spherical particles are used than in the case where spherical particles of the same material are used, provided the latter possess a comparable particle size and/or particle-size distribution. Conversely, in the case of the spherical variant, such formulations can be provided with significantly higher fill levels than in the case of the non-spherical embodiment. The reason for this is that the internal friction in formulations filled with non-spherical particles is increased by the tendency of the particles to get caught up with one another when they move past one another within the formulation as a result of the action of external shearing forces. In the case of spherical particles, in contrast, they are better able to slide past one another.

The capacity to achieve much higher volume fill levels under comparable conditions when using spherical particles in formulations filled therewith is of great relevance in practice: firstly, for example, for adhesive bonding materials which are to serve as encapsulating compositions (moulds, encapsulants), it is eventually possible after curing to realize composites having minimized coefficients of thermal expansion, without detriment to the pre-cure processing properties of the liquid adhesive precursors as a result of the introduction of the filler. Moreover, in adhesive materials which are employed for underfilling in the joining of semiconductor components (underfills), there is a limitation on the maximum particle size of fillers. In view of the increasing trend for minimalization, the limit here may be well within the sub-microscale range. Because of the particle-particle interactions, which become ever more effective as the particle size goes down, there is frequently a sharp rise in the viscosity of the precursors of such composites even at relatively low fill levels. A limit is quickly reached here at which the processability of the precursor is no longer ensured. Through the use of spherical filler particles it is possible to achieve a further marked increase in the maximum attainable fill level, relative to the value achievable in the case where non-spherical particles are used. In these cases, the adhesive precursor retains its processability even at higher fill levels. At the same time, the coefficient of thermal expansion of the adhesive material after curing is reduced significantly in accordance with the requirement.

The particles with negative thermal expansion are of great importance for the adhesive industry: by addition as a filler to a polymer/multi-component adhesive, the inherent thermal expansion of the adhesive can be greatly minimized and therefore any discrepancy between the different expansion behaviours of the materials to be joined can be reduced. Mechanical stresses between the components to be joined are significantly reduced as a result, and the lifetime of the overall component is significantly prolonged or indeed made possible to a degree considerable for the application, particularly in the case of adhesive bonding in chip technology (moulding, potting, underfill), but also in the context of other technical bonding issues (e.g. automotive, lens construction in cameras).

Working Examples

Examples of production of particles having a negative coefficient $\alpha$ of thermal expansion and a sphericity $\Psi$ of at least 0.7:

Production of spherical particles with $ZrWO_2O_8$ as main crystal phase of a glass-ceramic composed of the phase system $ZrO_2$—$WO_3$—$Al_2O_3$—$P_2O_5$—

Shaping directly from the green glass melt

A starting glass for an eventual negative-expansion glass-ceramic of the composition 24.2 wt % $ZrO_2$, 68.6 wt % $WO_3$, 1.4 wt % $Al_2O_3$ and 5.8 wt % $P_2O_5$ was melted in a discharge crucible at a temperature of 1650° C.

In the melting assembly selected, the glass melt was held at a temperature of 1550° C. It was discharged from a nozzle with a diameter of 1 mm positioned on the base of the crucible. The glass jet thus produced was dropped onto a 53-toothed striking wheel 8 mm thick and with an outer diameter of 135 mm, this wheel rotating at a frequency of 5000 rpm about its own axis. In this way, the glass stream was filementized into individual pieces, and accelerated with an angle of inclination of between 20 to 30° as measured with respect to the horizontal. It was subsequently passed through a tubular furnace 3 m long, constructed in a curved shape and heated to 1550° C. with two gas burners, this furnace mimicking the flight path of the filamentized glass stream. As a result of the tendency to minimize the surface energy, the filaments in elongate form underwent a change in shape to spheres. Following emergence from the tubular furnace, the glass spheres were cooled by further flight in air until sufficient dimensional stability was achieved, and were finally captured in a collecting vessel.

The cooled, very largely X-ray-amorphous green glass spheres produced by the hot shaping operation described were ceramicized and so converted into the eventual negative-expansion glass-ceramic in the course of a further temperature treatment at a maximum temperature of 650° C. and a hold time of 12 to 24 hours.

Shaping by Rounding of Non-Spherical Green Glass Particles

A starting glass for an eventual negative-expansion glass-ceramic of the composition 24.2 wt % $ZrO_2$, 68.6 wt % $WO_3$, 1.4 wt % $Al_2O_3$ and 5.8 wt % $P_2O_5$ was melted in a discharge crucible at a temperature of 1650° C.

In the melting assembly selected, the glass melt was held at a temperature of 1550° C. It was discharged from a nozzle with a diameter of 1 mm, positioned on the base of the crucible, into a nip between two contra-rotating, water-cooled rolls, where it was quenched to form a green glass ribbon. The green glass ribbon was singularized into small splinters mechanically, using a hammer.

The glass splinters were roughly comminuted by preliminary grinding in a bead mill, and the powder fraction having a particle size $d_{100}$<100 µm was removed by sieving from this roughly comminuted material. This green glass powder isolated by sieving was comminuted further in an additional downstream step of dry grinding in an opposed-jet mill to a particle size with a distribution of $d_{10}$=0.8 µm, $d_{50}$=5.2 µm, $d_{90}$=12.4 µm and $d_{99}$=18.8 µm.

By introduction of the powder into an oxyhydrogen gas flame, the glass particles are melted again, and experience rounding in the process, owing to the tendency for minimization of the surface energy. On emergence from the flame, the particles are allowed to cool and are captured in a collecting vessel.

The cooled, very largely X-ray-amorphous green glass spheres produced by the hot shaping operation described were ceramicized and so converted into the eventual negative-expansion glass-ceramic in the course of a further temperature treatment at a maximum temperature of 650° C. and a hold time of 12 to 24 hours.

Filamentization of Salt Melts for Producing Spherical $Y_2Mo_3O_{12}$ Particles 964 g of yttrium acetate tetrahydrate and 754 g of ammonium molybdate tetrahydrate were introduced into a ball mill, where they were ground for 4 hours to produce an ideally homogeneous powder mixture. The grinding balls used for this purpose were $Al_2O_3$ balls with a diameter of 40 mm.

After sieving to remove the balls, the powder mixture was placed into a platinum discharge crucible, where it was cautiously brought to a temperature of 100° C., just above the melting point of ammonium molybdate tetrahydrate, which is at 90° C. A salt melt is formed, which was discharged via a nozzle having a diameter of 2 mm that was positioned on the base of the crucible. The jet generated in this way and consisting of the salt melt was dropped onto a 53-toothed striking wheel 8 mm thick with an outer diameter of 135 mm, this wheel rotating at a frequency of 5000 rpm about its own axis. In this way, the jet consisting of the salt melt was filamentized into individual pieces and accelerated with an angle of inclination of between 20 to 300 as measured with respect to the horizontal. It was subsequently passed through a tubular furnace 3 m long and of curved construction that mimicked the flight path of the filamentized jet consisting of the salt melt. The furnace was heated electrically so as to be maintained in the entry zone at moderate temperatures of 100-120° C., so that the salt melt was retained and the filaments, initially still of elongate form, underwent a change in shape, owing to the tendency for minimization of the surface energy, into spheres which are still liquid. In the downstream zones, the temperature selected was then significantly higher—temperatures of around 900° C. were achieved here. Here, therefore, there was a first step of calcination of the liquid spheres, forming porous, pre-ceramic particles as an intermediate. Following emergence from the tubular furnace, these spheres were allowed to cool by further flight in air and were finally captured in a collecting vessel.

The porous, pre-ceramic particles were compacted in a further calcination step in an oven at 900° C. with a hold time of 7-8 hours to give the eventual spheres consisting of negative-expansion $Y_2Mo_3O_{12}$ material.

Production of Spherical $ZRW_2O_8$ Particles Via Spray Calcination Using the Pulsation Reactor Method 584.5 g (2.0 mol) of ethylenediaminetetraacetic acid (EDTA) were suspended in 6.0 L (333 mol) of water. In parallel to this, 560 g (4.0 mol) of 25% strength aqueous ammonium hydroxide solution were introduced into 3.6 L (200 mol) of water. The ammonium hydroxide solution was subsequently added dropwise with stirring to the EDTA solution. This partially neutralized EDTA solution was subsequently admixed with 644.5 g (2.0 mol) of zirconium oxydichloride octahydrate $ZrOCl_2 \times 8\ H_2O$. This resulted in production of a thick white precipitate which dissolved again when the solution was heated to 100° C. The solution was stirred at this temperature for 1 hour and then left to cool overnight. By partial precipitation of the colourless crystals of a Zr-EDTA complex, a turbid solution developed and was concentrated to dryness on a rotary evaporator. The solid residue of the mixture of Zr-EDTA complex and $NH_4Cl$ (weight ratio: 78%:22%) was subsequently dried at 110° C. for 24 h.

292.2 g (1.0 mol) of ethylenediaminetetraacetic acid were dissolved in 5.0 L (278 mol) of water and then admixed with 300 ml (2.0 mol) of 25% strength aqueous ammonium hydroxide solution. Dissolved therein were 463.7 g (1.7 mol $WO_3$ equivalent) of ammonium metatungstate hydrate $(NH_4)_6H_2W_{12}O_{40} \times n\ H_2O$ (85 wt % $WO_3$). Then 487.1 g of the Zr-EDTA complex/$NH_4Cl$ mixture (i.e. 1.0 mol of Zr-EDTA complex) were added and dissolved therein with gentle heating.

The solution is conveyed with the aid of a peristaltic pump into a pulsation reactor at a volume flow rate of 3 kg/h, where via a 1.8 mm titanium nozzle it is finely atomized into the reactor interior, where it is subjected to thermal treatment. The temperature of the combustion chamber here is maintained at 1300° C., and that of the resonance tube at 1200° C. The ratio of the quantity of combustion air to the quantity of fuel (natural gas) was 10:1 (air.gas).

The powder is introduced into a cuboidal alpha-alumina crucible and placed in a chamber kiln. The material for calcining is brought to a temperature of 1200° C. in the kiln, in an air atmosphere, for complete compaction of the spherical micro-scale particles consisting of $ZrW_2O_8$, and, after the temperature treatment, is quenched suddenly by being introduced into a stream of cold air, so that the mixed oxide which is meta-stable at room temperature had no opportunity to break back down into the individual components.

Production of spherical $ZrW_2O_8$ particles via the droplet formation process 58.5 g (0.2 mol) of zirconium oxychloride octahydrate $ZrOCl_2 \times 8\ H_2O$ were added to 500 mL (27.8 mol) of water and dissolved therein. Added to the mixture additionally were 252.2 g (1.2 mol) of citric acid monohydrate, and dissolution took place. The compound functioned as a complexing agent for stabilizing the $Zr^{4+}$ ions, in order to prevent their premature precipitation in the course of further processing. In parallel, a separate solution was prepared from 90 g (0.33 mol of $WO_3$ equivalent) of ammonium metatungstate $(NH_4)_6H_2W_{12}O_{40} \cdot xH_2O$ (85% $WO_3$) in 500 mL of water. The two solutions were then combined.

By means of a droplet formation process via dies and/or cannulas, gel bodies with sizes of 0.3 to 2.5 mm were obtained in a dimensionally stable manner from the above-prepared parent solution by immersion and also reaction in an ammonia solution at a temperature of 60° C.

These gel bodies were subsequently shaped by calcining to form sintered spheres, by a sintering process. Sintering took place in an air atmosphere under atmospheric pressure. A first step involved heating to 700-800° C. and holding there for 12 hours, in order to burn the organic constituents out of the gel without residue. The temperature was subsequently raised to 1180° C. where it was held for a further 2 hours to produce the actual reactive sintering. In order to prevent the $ZrW_2O_8$, which is meta-stable at room temperature, breaking down into the individual oxides, the ceramic $ZrW_2O_8$ spheres formed were placed in a cold stream of air to cool.

Examples relating to the production of composite materials of the invention (production of formulations filled with micro-scale and sub-micro-scale particles of high sphericity from a negative-expansion material).

Production of an epoxy resin precursor filled with microscale, negative-expansion filler particles for use as mould/encapsulant adhesive material in packaging applications in the semiconductor field (IC packaging)

10.0 g of a bisphenol A diglycidyl ether-based epoxy resin (density: 1.16 g/cm) with a zero-shear viscosity of 0.6 Pa s were admixed with 69.4 g of glass-ceramic powder with $ZrWO_2O_8$ as main crystal phase of a glass-ceramic composed of the phase system $ZrO_z$—$WO_3$-$A_2O_3$—$P_2O_5$ (coefficient of thermal expansion in the temperature range between 75 and 125° C.: -2.2 ppm/K; density: 5.37 g/cm) having a particle size distribution of $d_{10}$=1.27 µm, $d_{50}$=8.56

μm, $d_{90}$=17.33 μm and $d_{99}$=26.14 μm. The particles thereof possessed a sphericity of on average Ψ=0.93. For sufficient dispersal of the filler powder, the mixture was homogenized on a tumbler for an hour. The resulting adhesive precursor had a volume fill level of 60 vol % and shear-thinning flow behaviour, with the zero-shear viscosity being 114 Pa s. It could therefore still be processed in packaging applications in the semiconductor sector (IC packaging) in relation to the intended use as mould/encapsulant adhesive material.

An attempt was made to use the same procedure to produce an adhesive precursor with a glass-ceramic powder consisting of non-spherical particles (Ψ=0.58) with $ZrW_2O_8$ as main crystal phase of a glass-ceramic composed of the phase system $ZrO_2$—$WO_3$—$Al_2O_3$—$P_2O_8$, having a particle-size distribution with the following values: $d_{10}$=1.08 μm, $d_{50}$=7.78 μm, $d_{90}$=15.26 μm, $d_{99}$=21.06 μm. In these cases, however, all that was obtained was a kneadable composition which could no longer be handled using metering apparatus and metering methods that are commonly employed in the context of the target application.

Production of an epoxy resin precursor, filled with sub-micro-scale, negative-expansion filler particles, for use as underfill adhesive material in packaging applications in the semiconductor field (IC packaging)

20.0 g of a bisphenol A diglycidyl ether-based epoxy resin (density: 1.16 g/cm³) with a zero-shear viscosity of 0.6 Pa s were admixed with 43.5 g of glass-ceramic powder with $ZrW_2O_8$ as main crystal phase of a glass-ceramic composed of the phase system $ZrO_2$—$WO_3$-$A_2O_3$—$P_2O_8$ (coefficient of thermal expansion in the temperature range between 75 and 125° C.: −2.2 ppm/K; density: 5.37 g/cm) having a particle size distribution of $d_{10}$=0.18 μm, $d_{50}$=0.56 μm, $d_{90}$=1.17 μm and $d_{99}$=1.82 μm. The particles thereof possessed a sphericity of Ψ=0.91. For sufficient dispersal of the filler powder, the mixture was homogenized on a tumbler for an hour. The resulting adhesive precursor had a volume fill level of 32 vol % and Newtonian flow behaviour, with the viscosity being 13 Pa s. It could therefore still be processed in packaging applications in the semiconductor sector (IC packaging) in relation to the intended use as underfill adhesive material.

An attempt was made to use the same procedure to produce an adhesive precursor with a glass-ceramic powder consisting of non-spherical particles (Ψ=0.58) with $ZrW_2O_8$ as main crystal phase of a glass-ceramic composed of the phase system $ZrO_2$—$WO_3$—$Al_2O_3$—$P_2O_5$, having a particle-size distribution with the following values: $d_{10}$=0.09 μm, $d_{50}$=0.36 μm, $d_{90}$=0.91 μm, $d_{99}$=1.55 μm. In these cases, however, an adhesive precursor was obtained having a zero shear viscosity of 85 Pa s which could be handled only with great difficulty using metering apparatus and metering methods that are commonly employed in the context of the target application.

What is claimed is:

1. A composite material, comprising:
   a first material; and
   particles having a negative coefficient of thermal expansion and a sphericity of at least 0.7, wherein the particles are present in at least 30 vol % of the composite material at a particle size of $d_{50}$≤1.0 μm or are present in at least 40 vol % of the composite material at a particle size $d_{50}$>1.0 μm,
   wherein the particles comprise:
   i) a compound selected from a group consisting of $ZrW_2O_8$, $Y_2Mo_3O_{12}$, $LiAlSiO_4$, $LiAlSi_2O_6$, and
   ii) a phase system $ZrO_2$-$WO_3$-$Al_2O_3$-$P_2O_5$, or
   wherein the particle comprise $Y_2Mo_3O_{12}$, $LiAlSi_2O_6$, or a combination of $Y_2Mo_3O_{12}$ and $LiAlSi_2O_6$.

2. The composite material of claim 1, wherein the first material is selected from a group consisting of a polymer, a glass, and combinations thereof.

3. The composite material of claim 1, wherein the first material is selected from a group of consisting of epoxy resins, glass frits, glass solders, and combinations thereof.

4. The composite material of claim 1, wherein the negative coefficient of thermal expansion of the particles is in a range from $-1.0 \times 10^{-6}$/K to $-100 \times 10^{-6}$/K in the temperature range from −50° C. to 200° C.

5. The composite material of claim 1, wherein the particles are spray calcination particles.

6. The composite material of claim 1, wherein the particles are pulsation reactor particles.

7. An adhesive bonding material, comprising
   a composite material including a first material and particles, the particles having a negative coefficient of thermal expansion and a sphericity of at least 0.7, wherein the particles are present in at least 30 vol % of the composite material at a particle size of $d_{50}$≤1.0 μm or are present in at least 40 vol % of the composite material at a particle size $d_{50}$>1.0 μm,
   wherein the particles comprise:
   i) a compound selected from a group consisting of $ZrW_2O_8$, $Y_2M_3O_{12}$, $LiAlSiO_4$, $LiAlSi_2O_6$, and
   ii) a phase system $ZrO_2$-$WO_3$-$Al_2O_3$-$P_2O_5$, or
   wherein the particle comprise $Y_2Mo_3O_{12}$, $LiAlSi_2O_6$, or a combination of $Y_2Mo_3O_{12}$ and $LiAlSi_2O_6$.

8. The adhesive bonding of claim 7, wherein the first material is selected from a group consisting of a polymer, a glass, and combinations thereof.

9. The adhesive bonding material of claim 7, wherein the first material is selected from a group consisting of epoxy resins, glass frits, glass solders, and combinations thereof.

10. The adhesive bonding material of claim 7, wherein the particles comprise a compound selected from a group consisting of $ZrW_2O_8$, $Y_2Mo_3O_{12}$, $LiAlSiO_4$, $LiAlSi_2O_6$, and a phase system $ZrO_2$—$WO_3$—$Al_2O_3$—$P_2O_5$.

11. The adhesive bonding material of claim 7, wherein the negative coefficient of thermal expansion of the particles is in a range from $-1.0 \times 10^{-6}$/K to $-100 \times 10^{-6}$/K in the temperature range from −50° C. to 200° C.

12. The adhesive bonding material of claim 7, wherein the particles are spray calcination particles.

13. The adhesive bonding material of claim 7, wherein the particles are pulsation reactor particles.

* * * * *